(12) United States Patent
Hoffe et al.

(10) Patent No.: US 6,313,459 B1
(45) Date of Patent: Nov. 6, 2001

(54) METHOD FOR CALIBRATING AND OPERATING AN UNCOOLED AVALANCHE PHOTODIODE OPTICAL RECEIVER

(75) Inventors: Ronald D. Hoffe, Kanata; Collin G. Kelly, Ottawa; Marc A. Nadeau; Ping W. Wan, both of Kanata; Ashley A. Truscott, Ottawa, all of (CA)

(73) Assignee: Nortel Networks Limited, Montreal (CA)

( * ) Notice: Subject to any disclaimer, the term of this patent is extended or adjusted under 35 U.S.C. 154(b) by 0 days.

(21) Appl. No.: 09/583,283

(22) Filed: May 31, 2000

(51) Int. Cl.[7] .................................................. H01J 40/14
(52) U.S. Cl. .............................. 250/214 R; 250/214 AG; 327/514
(58) Field of Search .......................... 250/214 R, 24 AG, 250/214 C, 214 DC; 327/513, 514; 361/93.8

(56) References Cited

U.S. PATENT DOCUMENTS

| | | |
|---|---|---|
| 4,236,069 | 11/1980 | Laughlin ........................ 250/214 AG |
| 4,495,410 | 1/1985 | Minami et al. ................ 250/214 AG |
| 4,599,527 | 7/1986 | Beaudet et al. ....................... 327/513 |
| 5,004,907 | 4/1991 | Prasse ........................... 250/214 AG |
| 5,015,839 | 5/1991 | Tanikoshi ...................... 250/214 AG |
| 5,396,059 | 3/1995 | Yeates .............................. 250/214 C |
| 5,548,112 | 8/1996 | Nakase et al. .................... 250/214 C |
| 5,953,690 | 9/1999 | Lemon et al. ....................... 702/191 |
| 6,157,022 | * 12/2000 | Maeda et al. ..................... 250/214 R |

* cited by examiner

*Primary Examiner*—John R. Lee
*Assistant Examiner*—Kevin Pyo

(57) ABSTRACT

The present invention comprises an operational algorithm, and calibration process, for an avalanche photodiode (ADP) receiver which takes into account an APD behavioral model. In-situ optical and electrical measurements (calibration) of the APD are performed to determine key constants for use in the model. Knowledge of these constants allows for optimum operation of the APD over a wide range of input optical power. The operational algorithm also gives an estimate of input optical power over a wide range of ambient temperatures.

17 Claims, 5 Drawing Sheets

METHOD FOR CALIBRATING AND OPERATING AN UNCOOLED AVALANCHE PHOTODIODE OPTICAL RECEIVER

FIELD OF THE INVENTION

The present invention relates to receivers in optical communication systems and, more particularly, to a method for calibrating and operating an uncooled avalanche photodiode optical receiver.

BACKGROUND OF THE INVENTION

Optical communication systems use optical fiber as a communication medium and light as an information carrier. For instance, an optical signal may be a beam of light modulated to represent binary-coded information. When light is used to transmit information, the information may be extracted from the beam of light through the use of a photodetector in a receiver. A photodetector is an electronic component that detects the presence of light radiation through conversion of light energy to electrical energy. A common photodetector is called a photodiode which consists of a semiconductor having a property called photoconductivity, in which the electrical conductance varies depending on the intensity of radiation striking the semiconductor material comprising the photodiode. Essentially, a photodiode is the same as an ordinary diode, except that the package has some transparency that allows light energy to effect junctions between the semiconductor materials inside.

An optical receiver using an avalanche photodiode (APD) features a built-in gain as part of the optical-to-electrical conversion process. This built-in gain makes APD receivers attractive as receivers in high bit-rate optical communication systems. However, the built-in gain requires very careful bias (operating condition) control and temperature compensation to maintain system performance over a wide range of optical input powers. This is especially true when the APD receiver does not contain any active cooling circuitry.

In U.S. Pat. No. 5,953,690, issued to Lemon et al. Sep. 14, 1999, an intelligent fiber-optic receiver is disclosed. During calibration procedures for the receiver, an optical-to-electrical conversion device (avalanche photodiode or PIN photodiode) and its supporting control and monitoring circuits in a receiver module are characterized over a defined operating temperature range. Characteristic data and/or curves defining these operational control and monitoring functions over the range of operating conditions (temperature, power supply) are stored in non-volatile memory. During operation, an embedded micro-controller, together with analog to digital converters, digital to analog converters and other associated circuitry, dynamically controls the operational constants of the module based on the current operating conditions (temperature, power supply). Unfortunately, this approach, which employs a thermal chamber while measuring receiver performance at the extremes of operating temperature, may be very time consuming and hence costly. Further, this approach may not be suited to volume manufacturing of receivers.

SUMMARY OF THE INVENTION

The present invention comprises an operational algorithm, and calibration process, for an avalanche photodiode (ADP) receiver which takes into account an APD behavioral model. In-situ optical and electrical measurements (calibration) of the APD are performed to determine key constants for use in the model. Knowledge of these constants allows for optimum operation of the APD over a wide range of input optical powers. The operational algorithm also gives an estimate of input optical power over a wide range of ambient temperatures.

In accordance with an aspect of the present invention there is provided a method of operating an optical receiver, the optical receiver including an avalanche photodiode, where the method includes receiving an indication of temperature magnitude of the avalanche photodiode and determining breakdown voltage magnitude for the avalanche photodiode corresponding to the received temperature magnitude indication. The method farther includes determining bias voltage magnitude for the avalanche photodiode as a function of the breakdown voltage magnitude and an avalanche photodiode current magnitude, where the avalanche photodiode current magnitude is set at a predetermined constant magnitude, and outputting the bias voltage magnitude. In another aspect of the invention an optical receiver is provided including an avalanche photodiode, a bias control circuit to control a bias voltage supplied to the avalanche photodiode and a bias control processor for performing this method. In a further aspect of the present invention, there is provided a software medium that permits a general purpose computer to carry out this method.

In accordance with another aspect of the present invention there is provided a method of determining magnitude of optical power input to an avalanche photodiode including receiving an indication of temperature magnitude of the avalanche photodiode, determining breakdown voltage magnitude for the avalanche photodiode corresponding to the received temperature magnitude, receiving an indication of avalanche photodiode bias voltage magnitude, receiving an indication of avalanche photodiode current magnitude, determining gain magnitude of the avalanche photodiode as a function of the bias voltage magnitude, the breakdown voltage magnitude and the current magnitude and determining input optical power magnitude from the determined gain magnitude and the current magnitude.

In accordance with a still further aspect of the present invention there is provided a method of calibrating an avalanche photodiode optical receiver including determining a constant relating avalanche photodiode gain to bias voltage at low current levels, determining a constant relating avalanche photodiode gain to avalanche photodiode current and determining a first avalanche photodiode breakdown voltage at a calibration temperature.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

In the figures which illustrate example embodiments of this invention.

DETAILED DESCRIPTION OF THE PREFERRED EMBODIMENTS

Figure 1:
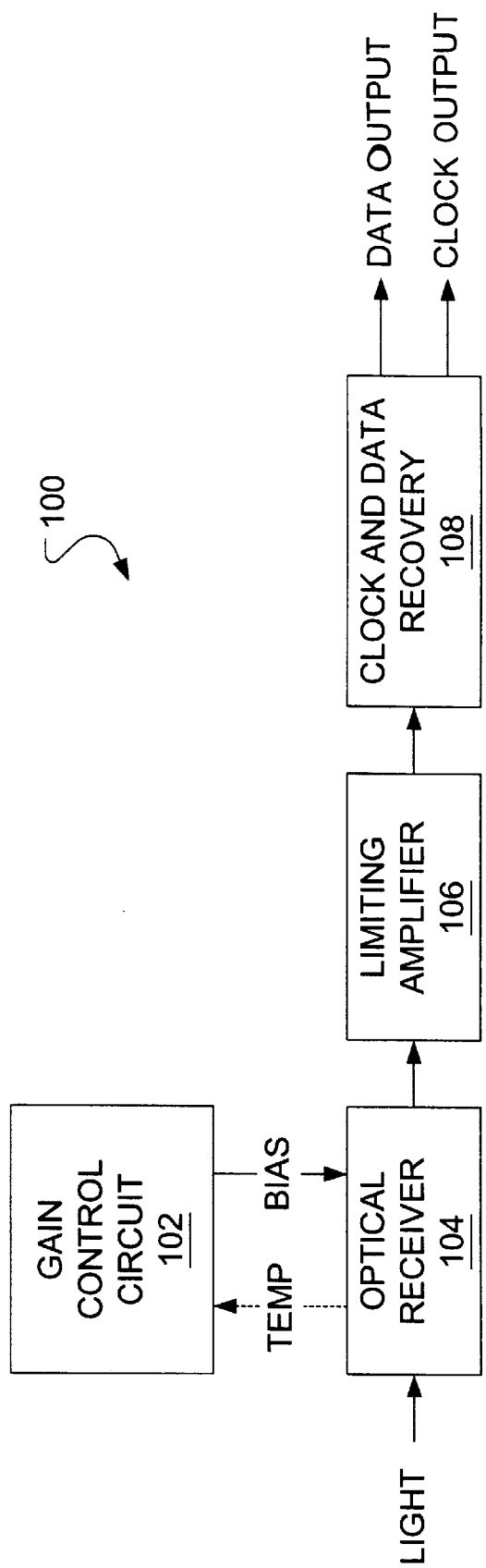
FIG. 1 schematically illustrates a circuit for use in receiving optical data communication in an embodiment of the present invention.

Illustrated in FIG. 1 is a circuit 100 for use in receiving optical data communication comprising optical receiver 104 for receiving an optical signal, a limiting amplifier 106 which receives an electrical representation of the optical signal received by receiver 104 and a clock and data recovery unit 108 for extracting a data stream and corresponding clock signal from the output of limiting amplifier 106. Based upon a temperature received from optical receiver 104, a gain control circuit 102 may adjust bias conditions of optical receiver 104.

Figure 2:
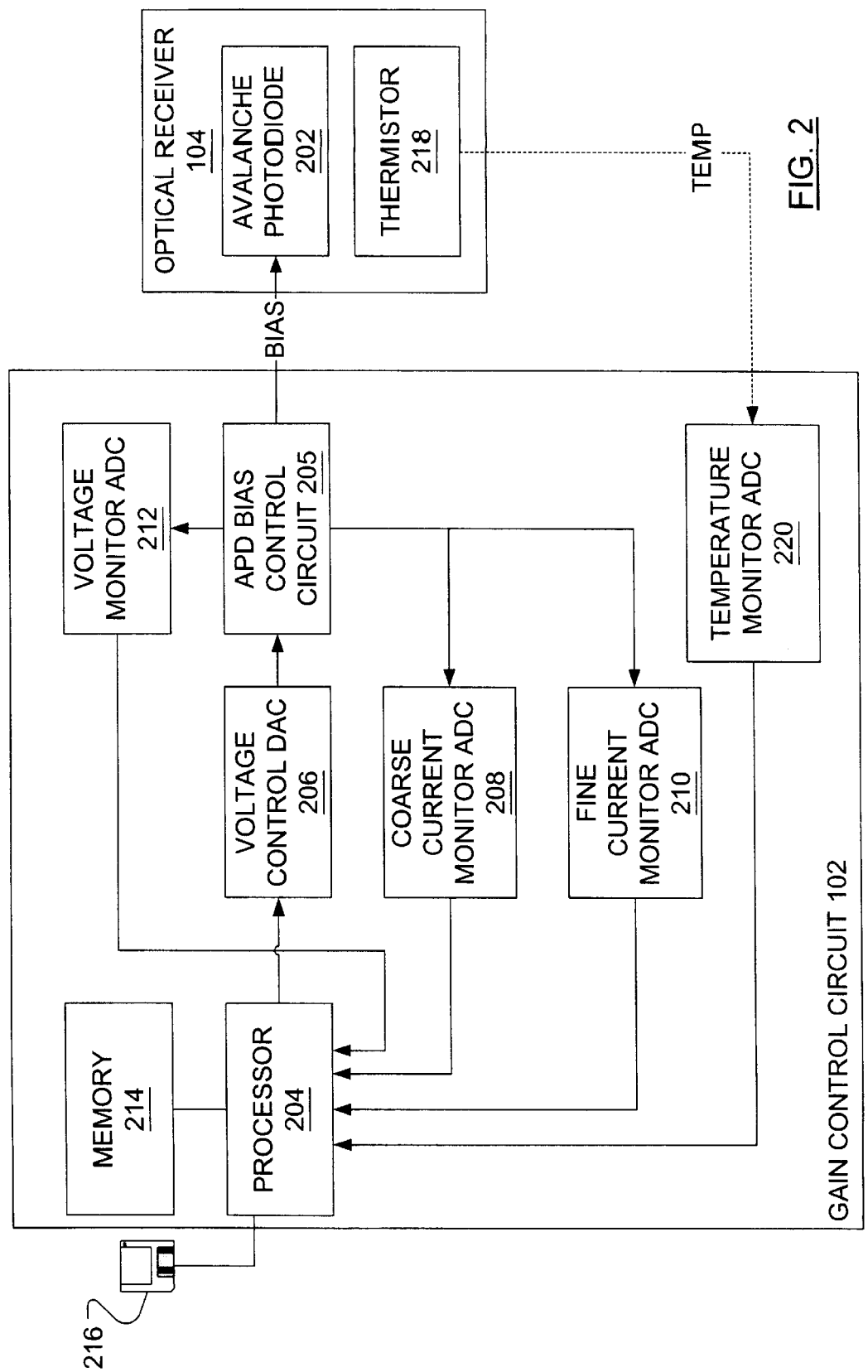
FIG. 2 schematically illustrates a voltage control loop for an avalanche photodiode (APD) in an embodiment of the present invention.

Turning to FIG. 2, gain control circuit 102 is illustrated as a constant voltage control loop, controlling an avalanche photodiode (APD) 202 integral to optical receiver 104. An APD bias control circuit 205 receives control signals from a processor 204 via a voltage control digital to analog converter (DAC) 206 and supplies bias voltage to APD 202. A coarse current monitor analog to digital converter (ADC) 208 and a fine current monitor ADC 210 feed back APD current information to processor 204 while a voltage monitor ADC 212 is used to feed back APD bias voltage information to processor 204. Optical receiver 104 further includes a thermistor 218 to provide information, via a temperature monitor ADC 220, to processor 204 regarding the operating temperature of APD 202. Constant data relating to APD 202 is stored in a memory 214 and made available to processor 204. Processor 204 is loaded with optical receiver operating software for executing the method of this invention from software medium 216. Software medium 216 may be a non-volatile "flash" memory, a disk, a tape, a chip or a random access memory containing a file downloaded from a remote source.

Figure 3:
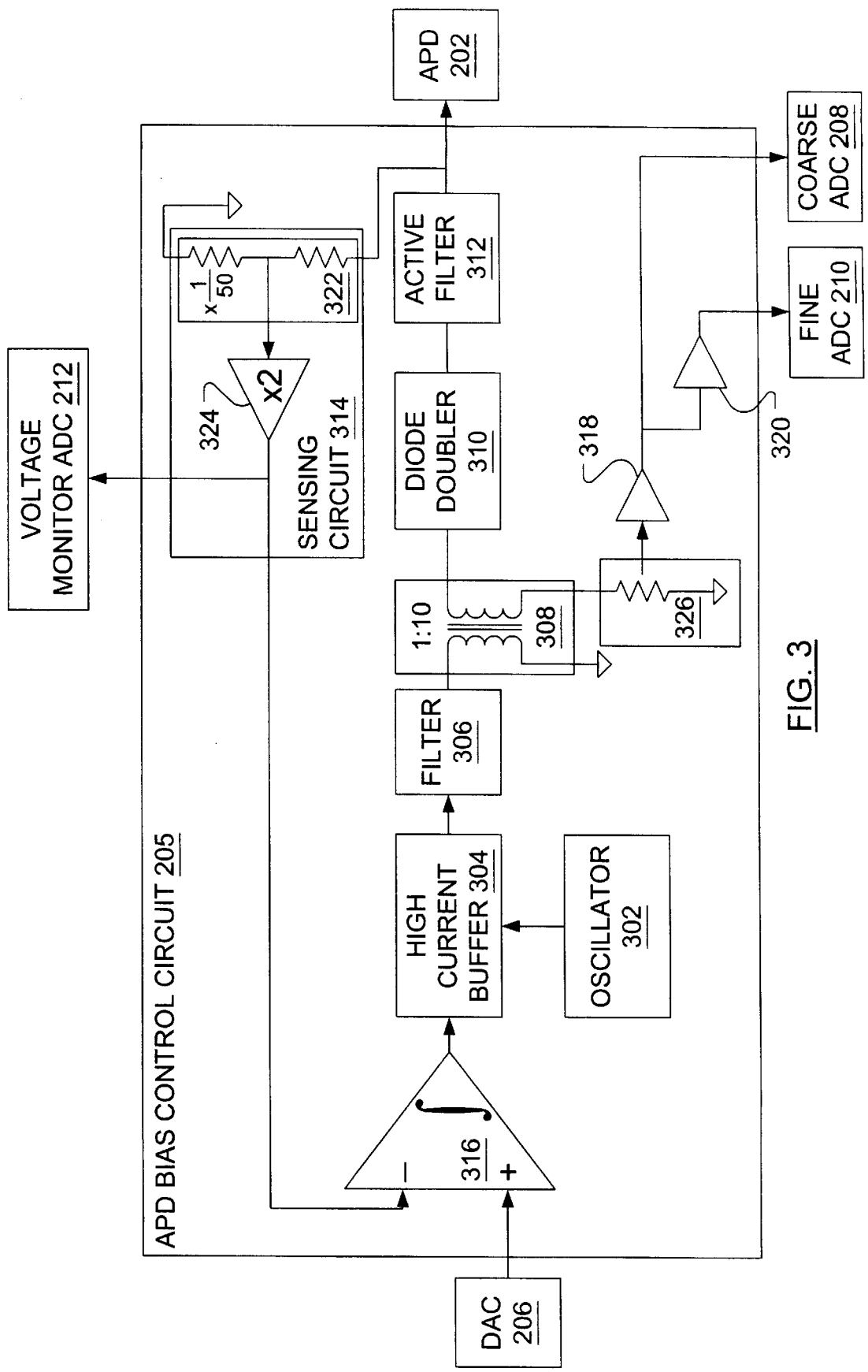
FIG. 3 schematically illustrates the APD bias control circuit of FIG. 1 in an embodiment of the present invention.

FIG. 3 illustrates, in detail, APD bias control circuit 205 of FIG. 2. A low voltage, 80 kHz, quasi-sinusoidal signal is generated and delivered to the primary of a step-up transformer 308. This quasi-sinusoid is obtained by filtering, with a low pass filter 306, the output of a high current buffer 304 that is being operated as a switch. A dedicated RC comparator-based oscillator 302 is used to switch high current buffer 304 on and off. The output of transformer 308 is rectified and filtered by a diode doubler 310. Further filter rejection is obtained by passing the obtained voltage through an active low pass filter 312 with a cut-off of lower than 80 kHz. Active low pass filter 312 has a large RC time constant (relative to the 80 kHz switching frequency). The output of active low pass filter 312 is sensed by a voltage sensing circuit 314 as well as being delivered to APD 202. Voltage sensing circuit 314, consisting of a high impedance voltage divider 322 and a buffer/amplifier 324, passes output to voltage monitor ADC 212. The output voltage of buffer/ amplifier 324 is compared to a desired APD bias voltage setpoint received from voltage control DAC 206 and the associated difference voltage (error signal) is integrated at an op-amp integrator 316. The integrated error signal is used as the low frequency bias voltage for the high current buffer 304 and thus controls the amplitude of the quasi-sinusoidal signal fed to transformer 308. Note that the combination of high current buffer 304, oscillator 302, filter 306 and integrator 316 is but one manner, of many, to generate the variable amplitude quasi-sinusoidal signal.

The APD bias voltage setpoint for error integrator 316 is received from voltage control DAC 206. As will be apparent to a person skilled in the art, this APD bias voltage setpoint may also be received, with less resolution, from an electrically erasable potentiometer with serial control.

The APD current is indirectly monitored, by monitoring the DC current through the secondary winding of transformer 308, with a current sensing circuit 326. The sensed current is fed, through a buffer 318, to ADC 208 for coarse (1 mA/V) current resolution and, through a buffer 320, to ADC 210 for fine (100 $\mu$A/V) current resolution. Note that the measured APD current contains a deterministic offset, due to the presence of the voltage divider based current sensing circuit 326.

In overview, the present invention involves controlling the gain of an APD through the control of APD bias voltage in view of a model relating APD gain to APD bias voltage. Initially, in-situ optical and electrical measurements (calibration) of the APD are performed to determine key constants for use in the model. The model constants determined during calibration are then stored in non-volatile memory, where they are used by a processor to control the APD bias voltage responsive to monitoring the APD current. To cover the wide current dynamic range (10 $\mu$A to 3 mA), two current monitors are used. An added feature of having a gain model for each APD is the ability to accurately estimate the input optical power by measuring the instantaneous APD bias voltage, APD current and temperature, and calculating the optical power from the model. Knowledge of the input optical power has the benefit of allowing for accurate fault monitoring.

The present invention requires monitoring of the APD current and APD temperature, and adjusting APD bias voltage to maintain an optimum APD gain. This is accomplished by adjusting APD bias voltage such that a desired APD bias voltage versus APD current curve is followed. This desired curve approximates a voltage versus current relationship for a resistive voltage source in which the voltage drop is a function of the square root of the current. Deviations from this desired curve occur at both low and high optical power levels, where the APD gain (and hence APD bias voltage) requires limiting to comply with maximum and minimum operating APD gain restrictions.

The goal is to determine APD current gain ($M_{APD}$) at any temperature (T) and bias voltage ($V_{APD}$) as given by $$M_{APD} = \frac{A}{V_b(T) - V_{APD} + k_m \sqrt{I_{APD}}} \qquad \text{Equation 1}$$

where A and $k_m$ are constants, $V_b(T)$ is APD breakdown voltage at temperature T and $I^{APD}$ is APD current, expressed in microamperes ($\mu$A). APD breakdown voltage may be determined from $$V_b(T) = V_b(T_{cal}) \times e^{\frac{\gamma(T - T_{cal})}{100}} \qquad \text{Equation 2}$$

where $T_{cal}$ is a calibration temperature at which breakdown voltage $V_b(T_{cal})$ is measured and the change in breakdown voltage with temperature is characterized by constant $\gamma$.

All but constant $\gamma$ is determined during a calibration procedure detailed hereinafter. The constant $\gamma$ may be determined by solving Equation 2 for $\gamma$ by measuring the APD breakdown voltage over a range of temperatures. However, determining $\gamma$ in this way may be time consuming. Preferably then, either a typical value or a manufacturer supplied value (e.g. for a particular batch) may be used for $\gamma$.

The calibration procedure and control strategy of this invention are based on a number of equations, as follows.

APD gain is considered to be relative to a typical photo-detector which simply converts received optical power ($P_{opt}$) to electrical current. The efficiency of the conversion may be represented by a responsivity, $\rho$, such that $I_{typical} = \rho P_{opt}$. An alternative representation of APD gain is then $$M_{APD} = \frac{I_{APD}}{\rho P_{opt}}. \qquad \text{Equation 3}$$

The optimum APD gain ($M_{OPT}$) may be defined as the gain required to obtain the maximum signal-to-noise ratio at a given optical receive power. Optimum APD gain decreases uniformly as a function of increasing optical input power. Empirically, the optimum APD gain is found to vary as the square root of the APD current, $$M_{OPT} = \frac{k_o}{\sqrt{I_{APD}}} \qquad \text{Equation 4}$$

where parameter $k_o$ is the APD gain scaling factor that is a function of circuit and other APD noise parameters. $k_o$ is analytically derived for all APD receivers and is assumed to be a constant. Again, APD current is measured in $\mu$A.

Thus, when we have optimnum gain, we can combine Equation 1 and Equation 4 to result in the following empirical relationship, upon which the APD control strategy of the present invention is based, $$V_{APD} = V_b(T) - k\sqrt{I_{APD}} \qquad \text{Equation 5}$$

where $$k = \frac{A}{k_o} - k_m.$$

The constant k is determined during calibration. As described hereinafter, constants A and $k_m$ are obtained directly, while the constant $k_o$ is obtained indirectly.

In Equation 1, Equation 4 and Equation 5, it is assumed that the APD dark current, and other systematic current flowing through the divider 326 is small as compared to $I_{APD}$; i.e. less than 2 $\mu$A, otherwise these currents must be factored in. Dark current is a current that flows under reverse bias conditions even in the absence of illumination.

The temperature coefficient $\gamma$ has to either be determined for each APD, or constrained to a sufficiently tight range such that a typical (or batch measured) value can be used. To alleviate the impact of using a typical value for $\gamma$ on the receiver sensitivity versus temperature performance, it is preferred to operate the APD at a constant current, $I_c$, at low optical power levels. Operation at constant current, $I_c$, assumes that APD dark current, etc. are small. Typically, a gain range (from $M_{min}$ to $M_{max}$) will be specified among the operating conditions for an optical receiver. A constant current, $I_c$, for optimum low power gain is determined after calibration, given knowledge of $k_o$, maximum gain, $M_{max}$, and use of Equation 4, $$I_c = \left(\frac{k_o}{M_{max}}\right)^2. \qquad \text{Equation 6}$$

Returning to FIG. 2, APD temperature may be derived from the resistance of thermistor 218 within optical receiver 104. A constant current ($I_{therm}$) of 100 $\mu$A is passed through thermistor 218 and the generated voltage is amplified and measured, over a range of 0 to 4.096 V, by temperature monitor ADC 220. The APD temperature is given by the Steinhart-Hart equation:

$$1/T = a + b \times \ln(R) + c \times [\ln(R)]^3 \qquad \text{Equation 7}$$

where T is temperature in Kelvin and R is thermistor resistance in ohms. Where $V_{ADC}$ is the voltage sensed by temperature monitor ADC 220, R may be determined from $$R = \frac{V_{ADC}}{3.72 I_{therm}}, \qquad \text{Equation 8}$$

where $I_{therm} = 100$ $\mu$A.

The circuit gain should be chosen such that, within expected circuit and thermistor tolerances, the voltage sensed by temperature monitor ADC 220 should not exceed 4.096V at 0° C.

The initial step of the APD calibration procedure is performed to estimate an offset current such that it may be applied to all currents in subsequent steps.

a) The offset current estimation procedure comprises:
 (i) blocking the optical input to APD 202;
 (ii) setting APD bias voltage $V_{APD}$ to 35 V (a number which safely keeps APD 202 from breakdown);
 (iii) measuring the APD current, which includes dark current and a systematic current flowing through divider 326 (FIG. 3), and calling this measured current $I_{offset}$ (a typical range for $I_{offset}$ is 2–3 $\mu$A);
 (iv) computing offset resistance as $$R_{offset} = \frac{V_{APD}}{I_{offset}},$$

it is assumed that $R_{offset}$ is constant;
 (v) storing $R_{offset}$ in memory 214 to enable calculation of $I_{offset}$ at any voltage $V_{APD}$. $I_{offset}$ may then be subtracted from any reported current.

b) The calibration procedure used for determining constant A comprises:
 (i) consecutively applying optical powers of −32 to −26 dBm, in 1 dB steps, to APD 202 and adjusting the APD bias voltage ($V_{APD}$) to maintain 10 $\mu$A of APD current;
 (ii) plotting the reciprocal of the APD gain $$\frac{1}{M_{APD}}$$

where $M_{APD}$ is determined from Equation 3), versus applied bias voltage, $V_{APD}$;
 (iii) applying linear curve fitting; and
 (iv) recording the APD temperature ($T_{cal}$).

The constant A is the reciprocal of the slope of the line obtained in step (iii) of this procedure, $$|A| = \frac{\delta V_{APD}}{\delta\left(\frac{1}{M_{APD}}\right)}. \qquad \text{Equation 9}$$

c) The calibration procedure used for determining constant $k_m$ comprises:
 (i) using the most recent APD bias condition (10 $\mu$A APD current) and increasing the optical power from −20 dBm to −8 dBm, in 1 dB steps;

(ii) recording the APD currents corresponding to each optical power level in the previous step;
(iii) calculating the APD gain at these three power levels (using Equation 3); and
(iv) plotting the reciprocal of the calculated APD gain, $$\frac{1}{M_{APD}},$$

versus the square root of the APD current, $\sqrt{I_{APD}}$.

A straight line is derived from a least squares fit to these 13 points. Significant deviation should be noted as it implies that the model does not fit well. The slope of this straight line should yield $k_m$, the dependency of APD gain on APD current, $$k_m = A \times \frac{\delta\left(\frac{1}{M_{APD}}\right)}{\delta(\sqrt{I_{APD}})}. \qquad \text{Equation 10}$$

d) The calibration procedure used for approximating the breakdown voltage of APD 202, $V_b(T_{cal})$, comprises making use of the value for $k_m$ determined in the previous calibration procedure. Returning to the $$\frac{1}{M_{APD}}$$

versus $V_{APD}$ plot, the intersection of the obtained line with the $V_{APD}$ axis corresponds to an applied APD bias voltage of $$V_{APD} = V_b(T_{cal}) + k_m\sqrt{I_{ADP}} \qquad \text{Equation 11}$$

where the APD current, $I_{APD}$, is known to be 10 $\mu$A. Equation 11 may then be solved for an approximate breakdown voltage of APD 202, $V_b(T_{cal})$.

e) If a manufacturer supplied value for $\gamma$ (say 0.175%° C.) is unavailable, procedures a) through d) of the calibration process may be repeated at a significantly different APD temperature, T, and the breakdown voltage, $V_b(T)$, noted. Equation 2 can be then be rearranged to solve for $\gamma$, $$\frac{\gamma}{100} = \frac{\ln[V_b(T)] - \ln[V_b(T_{cal})]}{(T - T_{cal})}. \qquad \text{Equation 12}$$

f) The calibration procedure used for determining constant $k_o$ takes into account the idea that once $T_{cal}$, $V_b(T_{cal})$, $\gamma$, A and $k_m$ have been either derived or measured, the APD gain can be predicted from a combination of Equation 1 and Equation 2, $$M_{APD} = \frac{A}{V_b(T_{cal}) \times e^{\frac{\gamma(T-T_{cal})}{100}} - V_{APD} + k_m\sqrt{I_{APD}}} \qquad \text{Equation 13}$$

where the APD current is measured in $\mu$A. For a set input optical power, the calibration procedure comprises:
(i) varying the APD bias voltage, $V_{APD}$, to find the APD bias voltage that results in maximum signal-to-noise ratio and, consequently, minimum bit error rate;
(ii) measuring the APD current, $V_{APD}$, in $\mu$A (with offset current correction) at the APD bias voltage that results in this maximum signal-to-noise ratio;
(iii) calculating the optimum APD gain, $M_{OPT}$, either by using Equation 13 or from input optical power and APD current measurements (using Equation 3); and
(iv) calculating constant $k_o$, by rearranging Equation 4 to give $$k_o = M_{OPT} \times \sqrt{I_{APD}}. \qquad \text{Equation 14}$$

In practice, the time required to derive $k_o$ and $\gamma$ is lengthy. It has been found that using pre-determined constants for these parameters, stored in non-volatile memory, saves time and gives acceptable performance.

The goal of the present invention is to control the APD bias voltage to achieve a desired APD gain. However, when optical receiver circuit 100 (FIG. 1) is carrying customer traffic, it is impossible to directly measure the APD gain. Consequently, the APD gain must be indirectly controlled through APD bias voltage and APD current control, and through knowledge of the expected APD characteristics.

The desired APD gain control strategy is realized indirectly through APD bias voltage control. There are three regimes of required bias voltage control for the APD and these regimes dictate the approach to bias voltage control. The three regimes correspond to APD operation at low received optical power, high received optical power and intermediate received optical power. At low optical powers, the APD must be biased close to its reverse breakdown voltage to achieve optimum APD gain. However, in this first regime, the APD gain is very sensitive to changes in the bias voltage and to changes in temperature. Optimum APD gain is achieved through the use of a constant APD current approach, since the product of the detected optical power and the APD gain is the APD current (Equation 3). At optimum APD gain with respect to receiver sensitivity, the product is almost constant (despite changes in optical power) and the required APD gain can be obtained by adjusting the bias voltage, as necessary, to achieve the constant APD current, $I_c$ (from Equation 6). This control approach circumvents the need for exact knowledge about the breakdown voltage of the APD, as the constant APD current automatically compensates for temperature (or aging) induced changes in breakdown voltage. At high optical powers, the APD gain must be reduced to a low value, to avoid APD or receiver overload. The APD gain, however, must not drop below a minimum value (say, $M_{max}$=3) to avoid bandwidth collapse. In this second regime, it is more appropriate to control APD bias voltage so as to maintain it at a constant value.

Figure 4:
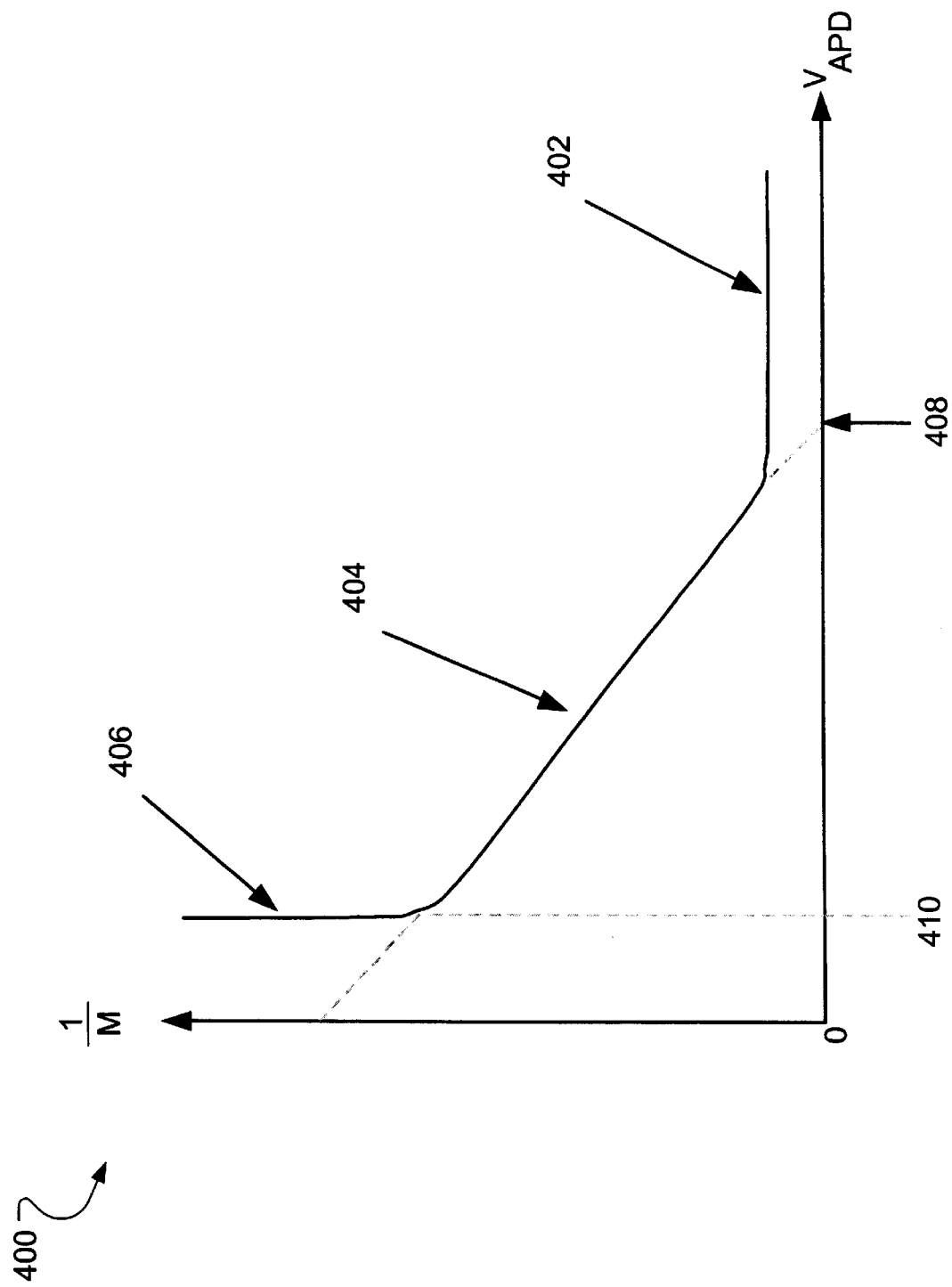
FIG. 4 illustrates, a plot of inverted gain versus APD bias voltage for an APD under control of a voltage control loop in an embodiment of the present invention.

A plot 400 of inverted gain versus APD bias voltage is shown in FIG. 4. A constant current region is illustrated at 402 corresponding to operation at low optical powers. A constant voltage region is illustrated at 406 corresponding to operation at high optical powers where the APD bias voltage may not be reduced below a value of APD bias voltage 410 at which the APD gain is at a specified lower limit ($M_{min}$). Connecting constant current region 402 and constant voltage region 406 is region 404 wherein APD bias voltage is proportional to the square root of APD current. An estimate of APD breakdown voltage is noted at 408.

Figure 5:
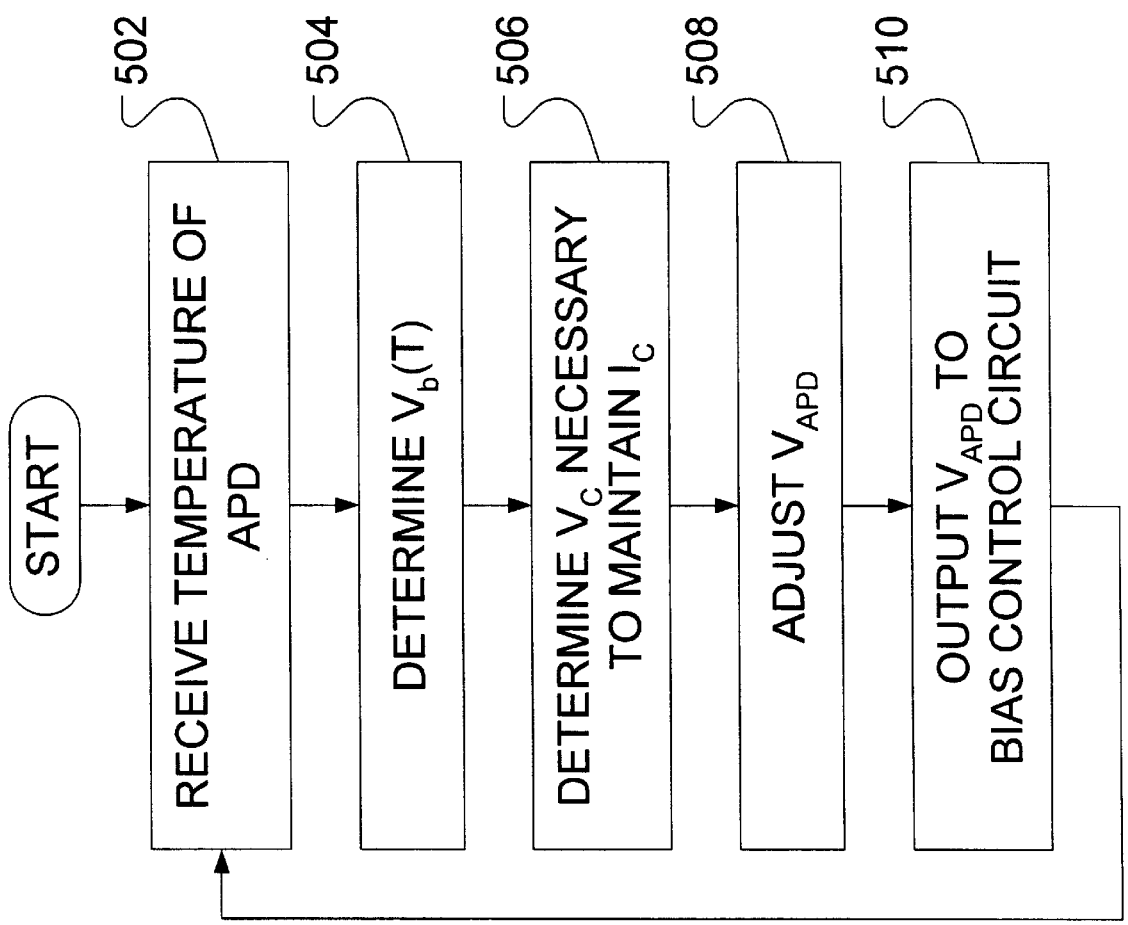
FIG. 5 illustrates, in a flow diagram, an APD bias voltage control method in an embodiment of the present invention.

With the constants A, $k_o$, $k_m$, $I_c$ and $\gamma$ predetermined and stored in memory 214 (FIG. 2), and noting that constant k is a combination of A, $k_o$ and $k_m$ (see Equation 5), the suggested APD bias voltage control procedure, illustrated in FIG. 5, assumes intermediate received optical power at first and adjusts according to received conditions. The control procedure comprises:

A) Given APD temperature T, received (step 502) from temperature monitor ADC 220 (FIG. 2), determining, from Equation 2, the APD breakdown voltage $V_b(T)$ (step 504). Determining a voltage $V_c$ (step 506), defined as the solution to Equation 5 where, in the equation, the APD current, $I_{APD}$, is set to the constant current $I_c$, k having been determined through calibration. APD bias voltage setpoint, $V_{APD}$, adjusted to be equal $V_c$ (step 508), is then communicated to APD bias control circuit 205 (step 510).

B) If the resulting measured APD current is below $I_c$, this means Equation 5 did not hold which implies the APD was not running at optimum gain and was probably running at low received optical power. To react to this, APD bias voltage setpoint, $V_{APD}$, communicated to APD bias control circuit 205 in step 510, is increased (step 508) until measured APD current reaches $I_c$, subject to the following constraints:

APD bias voltage does not exceed $V_b(T)$;

APD gain, $M_{APD}$, determined as the solution to Equation 1, does not exceed a specified maximum gain (say, $M_{max}$=10).

C) If, at any time, APD bias voltage, $V_{APD}$, required to maintain $I_c$ falls below $V_c$ (suggesting the APD is now running at high received optical power), an adjusted APD bias voltage setpoint is communicated to APD bias control circuit 205 (step 510). The goal of the adjustment is that Equation 5 is satisfied, subject to the constraint that the APD gain, $M_{APD}$ (Equation 1), does not fall below a specified minimum gain (say, $M_{min}$=3).

A secondary system goal relating to the APD control is the ability to estimate the detected optical power at optical receiver circuit 100 (FIG. 1). Although this goal is separate from APD gain control requirements, power estimation uses the same APD constants and equations that are required for APD bias voltage control. With the APD gain, at a particular APD bias voltage, APD current and APD temperature, known from Equation 1, and assuming responsivity $\rho=1$ A/W in Equation 3, the detected optical power may be estimated by dividing the APD current by the APD gain.

Other modifications will be apparent to those skilled in the art and, therefore, the invention is defined in the claims.

We claim:

1. A method of operating an optical receiver, said optical receiver including an avalanche photodiode, comprising:
   receiving an indication of temperature magnitude of said avalanche photodiode;
   determining breakdown voltage magnitude for said avalanche photodiode corresponding to said received temperature magnitude indication;
   determining bias voltage magnitude for said avalanche photodiode as a function of said breakdown voltage magnitude and an avalanche photodiode current magnitude, where said avalanche photodiode current magnitude is set at a predetermined constant magnitude; and
   outputting said bias voltage magnitude.

2. The method of claim 1 wherein said outputting comprises communicating said bias voltage magnitude to an avalanche photodiode bias control circuit.

3. The method of claim 1 further comprising:
   before said receiving, calibrating said avalanche photodiode to determine constants of said function; and
   storing said constants in a memory.

4. The method of claim 3 wherein said function equates said bias voltage magnitude to said breakdown voltage magnitude less a scaled square root of said avalanche photodiode current magnitude, where a scaling factor, by which said avalanche photodiode current magnitude is scaled, is determined during said calibrating.

5. The method of claim 1 further comprising:
   receiving an indication of avalanche photodiode current magnitude; and
   if said predetermined constant avalanche photodiode current magnitude exceeds said received indication of current magnitude, increasing said bias voltage magnitude until said avalanche photodiode current magnitude reaches said predetermined constant magnitude.

6. The method of claim 5 wherein said increasing said bias voltage magnitude includes limiting said bias voltage magnitude to maintain said bias voltage magnitude less than said breakdown voltage magnitude.

7. The method of claim 5 further comprising determining gain magnitude of said avalanche photodiode from a function of said bias voltage magnitude, said breakdown voltage magnitude and said received indication of current magnitude, wherein said increasing said bias voltage magnitude includes limiting said bias voltage magnitude to maintain said gain magnitude less than a predetermined maximum gain magnitude.

8. The method of claim 1 further comprising:
   receiving an indication of avalanche photodiode current magnitude;
   determining a necessary bias voltage magnitude to maintain said predetermined constant avalanche photodiode current magnitude; and
   if said determined bias voltage magnitude exceeds said necessary bias voltage magnitude, determining an adjusted bias voltage magnitude to satisfy said predefined model relating said bias voltage magnitude to said breakdown voltage magnitude and said avalanche photodiode current magnitude.

9. The method of claim 8 further comprising determining gain magnitude of said avalanche photodiode from a predefined model relating said gain magnitude to said bias voltage magnitude, said breakdown voltage magnitude and said indication of current magnitude, wherein said determining said adjusted bias voltage magnitude includes limiting said adjusted bias voltage magnitude to maintain said gain magnitude greater than a predetermined minimum gain magnitude.

10. A method of determining magnitude of optical power input to an avalanche photodiode comprising:
    receiving an indication of temperature magnitude of said avalanche photodiode;
    determining breakdown voltage magnitude for said avalanche photodiode corresponding to said received temperature magnitude;
    receiving an indication of avalanche photodiode bias voltage magnitude;
    receiving an indication of avalanche photodiode current magnitude;
    determining gain magnitude of said avalanche photodiode as a function of said bias voltage magnitude, said breakdown voltage magnitude and said current magnitude; and
    determining input optical power magnitude from said determined gain magnitude and said current magnitude.

11. A method of calibrating an avalanche photodiode optical receiver comprising:
    determining a constant relating avalanche photodiode gain to bias voltage at low current levels;
    determining a constant relating avalanche photodiode gain to avalanche photodiode current; and determining a first avalanche photodiode breakdown voltage at a calibration temperature.

12. The method of claim 11 further comprising determining an offset current.

13. The method of claim 11 wherein said step of determining said constant relating avalanche photodiode gain to bias voltage at low current levels comprises:

determining a gain for at least three optical power levels while maintaining a constant current value;

fitting a line to a plot of a reciprocal of said gain versus a bias voltage required to maintain said constant current; and determining said constant relating avalanche photodiode gain to bias voltage from the slope of said line.

14. The method of claim 11 wherein said step of determining said constant relating avalanche photodiode gain to avalanche photodiode current comprises:

recording avalanche photodiode current for each of at least three applied optical input power levels;

determining avalanche photodiode gain associated with each of said optical input power levels;

fitting a line to a plot of a reciprocal of said gain versus the square root of said avalanche photodiode current; and determining said constant relating avalanche photodiode gain to avalanche photodiode current from the slope of said line.

15. The method of claim 13 wherein said step of determining said first avalanche photodiode breakdown voltage comprises:

determining a bias voltage value at an intersection of said line with the bias voltage axis; and determining said first avalanche photodiode breakdown voltage from said bias voltage value, said constant current value and said constant relating avalanche photodiode gain to avalanche photodiode current.

16. An optical receiver comprising:

an avalanche photodiode;

a bias control circuit to control a bias voltage supplied to said avalanche photodiode;

a bias control processor operable to:

receive an indication of temperature magnitude of said avalanche photodiode;

determine breakdown voltage magnitude for said avalanche photodiode corresponding to said received temperature magnitude;

determine bias voltage magnitude for said avalanche photodiode as a function of said breakdown voltage magnitude and an avalanche photodiode current magnitude, where said bias voltage magnitude is necessary to maintain a predetermined constant avalanche photodiode current magnitude; and output said bias voltage magnitude to said bias control circuit.

17. A computer readable medium for providing program control to a bias control processor, said computer readable medium adapting said processor to be operable to:

receive an indication of a magnitude of temperature of said avalanche photodiode;

determine a magnitude of breakdown voltage for said avalanche photodiode corresponding to said received temperature magnitude;

determine bias voltage magnitude for said avalanche photodiode as a function of said breakdown voltage magnitude and an avalanche photodiode current magnitude, where said bias voltage magnitude is necessary to maintain a predetermined constant avalanche photodiode current magnitude; and output said bias voltage magnitude.

* * * * *

UNITED STATES PATENT AND TRADEMARK OFFICE
CERTIFICATE OF CORRECTION

PATENT NO. : 6,313,459 B1
DATED : November 6, 2001
INVENTOR(S) : Ronald Hoffe et al.

It is certified that error appears in the above-identified patent and that said Letters Patent is hereby corrected as shown below:

<u>Title page,</u>
Item [75], Inventors, replace "Ronald D. Hoffe, Kanata; Collin G. Kelly, Ottawa; Marc A. Nadeau; Ping W. Wan, both of Kanata; Ashley A. Truscott, Ottawa, all of (CA)" with -- Ronald D. Hoffe, Kanata; Colin G. Kelly, Ottawa; Marc A. Nadeau; Ping W. Wan, both of Kanata, all of (CA); Ashley A. Truscott, Santa Clara (US) --

Signed and Sealed this

Third Day of September, 2002

Attest:

Attesting Officer

JAMES E. ROGAN
*Director of the United States Patent and Trademark Office*